(12) United States Patent
Zhao

(10) Patent No.: US 11,189,796 B2
(45) Date of Patent: Nov. 30, 2021

(54) ARRAY SUBSTRATE AND MANUFACTURING METHOD THEREOF, AND DISPLAY PANEL

(71) Applicant: BOE Technology Group Co., Ltd., Beijing (CN)

(72) Inventor: Dejiang Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/765,534

(22) PCT Filed: Dec. 13, 2019

(86) PCT No.: PCT/CN2019/125383
§ 371 (c)(1),
(2) Date: May 20, 2020

(87) PCT Pub. No.: WO2020/168795
PCT Pub. Date: Aug. 27, 2020

(65) Prior Publication Data
US 2021/0217960 A1    Jul. 15, 2021

(30) Foreign Application Priority Data
Feb. 19, 2019    (CN) .......................... 201910121549.9

(51) Int. Cl.
*H01L 51/00*    (2006.01)
*H01L 27/32*    (2006.01)
(Continued)

(52) U.S. Cl.
CPC ...... *H01L 51/0012* (2013.01); *H01L 27/3211* (2013.01); *H01L 27/3246* (2013.01);
(Continued)

(58) Field of Classification Search
None
See application file for complete search history.

(56) References Cited

U.S. PATENT DOCUMENTS 9,995,963 B2    6/2018    Park et al.
2017/0146860 A1    5/2017    Ma
(Continued)

FOREIGN PATENT DOCUMENTS

CN    104297984 A    1/2015
CN    105044963 A    11/2015
(Continued)

OTHER PUBLICATIONS

Chinese Office Action dated Jan. 17, 2020 in related Chinese Application No. 201910121549.9.

*Primary Examiner* — Michelle Mandala
(74) *Attorney, Agent, or Firm* — Arent Fox LLP; Michael Fainberg

(57) ABSTRACT

Embodiments of the disclosure provide an array substrate and a manufacturing method thereof, and a display panel. The array substrate includes a base substrate, and a plurality of sub-pixel areas arranged on the base substrate and arranged in arrays, wherein each sub-pixel area includes an electrode structure, a function layer and a blocking layer arranged on the base substrate in sequence; the function layer includes a plurality of accommodating cavities arranged spaced with each other; the blocking layer is lyophobic and includes through holes in one-to-one corresponding to the accommodating cavities one by one; each sub-pixel area in the structure of the above array substrate includes a plurality of uniformly distributed accommodating cavities, and a charged solution is filled into the accommodating cavities.

17 Claims, 5 Drawing Sheets

(51) Int. Cl.
*H01L 51/52* (2006.01)
*H01L 51/56* (2006.01)
*H01L 51/50* (2006.01)

(52) U.S. Cl.
CPC ...... *H01L 27/3283* (2013.01); *H01L 51/5209* (2013.01); *H01L 51/5225* (2013.01); *H01L 51/56* (2013.01); *H01L 51/502* (2013.01)

(56) References Cited

U.S. PATENT DOCUMENTS

2018/0246380 A1 8/2018 Ma
2019/0384097 A1 12/2019 Cui et al.

FOREIGN PATENT DOCUMENTS

| CN | 106773281 A | 5/2017 |
| CN | 106932894 A | 7/2017 |
| CN | 108428720 A | 8/2018 |
| CN | 108682312 A | 10/2018 |
| CN | 109188821 A | 1/2019 |
| CN | 109658820 A | 4/2019 |
| EP | 3343611 A1 | 4/2018 |
| WO | 2009005751 A1 | 1/2009 |

ARRAY SUBSTRATE AND MANUFACTURING METHOD THEREOF, AND DISPLAY PANEL

CROSS REFERENCE OF RELATED APPLICATIONS

The present disclosure is a National Stage of International Application No. PCT/CN2019/125383, filed on Dec. 13, 2019, which claims priority from the Chinese patent application No. 201910121549.9, entitled Array Substrate, Manufacturing Method Thereof and Display Panel, submitted to Chinese Patent Office on Feb. 19, 2019, and the entire contents of which are fully incorporated by reference in the preset application.

FIELD

The present disclosure relates to the field of display technologies, and particularly relates to an array substrate and a manufacturing method thereof, and a display panel.

BACKGROUND

Quantum dot materials have the advantages of long service life and high color gamut, and are beneficial to improving the performance of display panels when being applied to the display panels.

SUMMARY

In a first aspect, an embodiment of the present disclosure provides an array substrate including a plurality of sub-pixel areas arranged in arrays, wherein the sub-pixel areas includes:

an electrode structure arranged on a base substrate;

a function arranged positioned on the base substrate, and including a plurality of accommodating cavities spaced with each other; and a blocking layer arranged on a side, away from the base substrate, of the function layer, and being lyophobic, wherein the blocking layer includes through holes in one-to-one corresponding to the accommodating cavities, and diameters of the through holes satisfy the following conditions: in response to that a voltage is not applied to the electrode structure, a charged solution on the blocking layer is prevented from entering the accommodating cavities; and in response to that a voltage of which the polarity is opposite to the charged solution on the blocking layer is applied to the electrode structure, the charged solution is allowed to enter the accommodating cavities.

In a possible implementation mode, in the above array substrate provided by the embodiment of the present disclosure, diameters of the accommodating cavities are greater than those of the through holes.

In a possible implementation mode, in the array substrate provided by the embodiment of the present disclosure, the diameters of the through holes are within the range of 8 μm-15 μm.

In a possible implementation mode, in the above array substrate provided by the embodiment of the present disclosure, the function layer includes a plurality of subfunction layers arranged in a stacking manner, and a lyophobicity of the subfunction layers is sequentially increased in a direction that the base substrate points to the blocking layer.

In a possible implementation mode, in the array substrate provided by the embodiment of the present disclosure, the electrode structure includes a plurality of first strip electrodes, and the first strip electrodes are distributed on two sides of the accommodating cavities in any column.

In a possible implementation mode, the above array substrate provided by the embodiment of the present disclosure also includes a second strip electrode which is arranged between any two adjacent sub-pixel areas in a row direction and the second strip extends in an extension direction same as that of the first strip electrodes.

In a possible implementation mode, in the above array substrate provided by the embodiment of the present disclosure, the first strip electrodes and the second strip electrodes are arranged in a same layer.

In a possible implementation mode, in the above array substrate provided by the embodiment of the present disclosure, the blocking layer includes a plurality of diversion grooves between the adjacent two sub-pixel areas in a row direction, the diversion grooves extend along the row direction.

In a possible implementation mode, in the above array substrate provided by the embodiment of the present disclosure, the blocking layer comprises a row blocking structure between the adjacent two sub-pixel areas in a row direction, the row blocking structure extends along the row direction.

In a possible implementation mode, the above array substrate provided by the embodiment of the present disclosure further includes a buffer layer arranged as a whole layer between the function layer and the base substrate, wherein the buffer layer is lyophilic.

In a possible implementation mode, the above array substrate provided by the embodiment of the present disclosure further includes an encapsulation layer arranged as a whole layer on a side, away from the base substrate, of the blocking layer.

In a possible implementation mode, in the above array substrate provided by the embodiment of the present disclosure, the charged solution is a quantum dot solution; and the array substrate further includes quantum dot light emitting parts arranged in the accommodating cavities, wherein the quantum dot light emitting parts have emitting colors corresponding to the sub-pixel areas and are formed through cured quantum dot solution.

In a second aspect, an embodiment of the present disclosure provides a manufacturing method of the array substrate, including the following steps:

providing a base substrate; and forming a pattern of an electrode structure in the sub-pixel areas on the base substrate, and simultaneously forming accommodating cavities in blocking layer and through holes in function layers via a one-time patterning process.

In a possible implementation mode, the manufacturing method provided by the embodiment of the present disclosure further includes:

sequentially filling the accommodating cavities of the sub-pixel areas of different colors with quantum dot solutions of colors corresponding to that of the sub-pixel areas, and curing the quantum dot solutions to form quantum dot emitting parts, wherein filling the accommodating cavities of each sub-pixel area of a single color with the quantum dot solution of a color corresponding to that of the each sub-pixel area comprises:

coating the blocking layer with the charged quantum dot solution of the single color, applying a voltage of which polarity is opposite to the quantum dot solution to the electrode structure in the each sub-pixel area corresponding to the single color of the quantum dot solution, so as to enable the quantum dot solution to enter the accommodating cavities in the each sub-pixel areas.

In a possible implementation mode, in the manufacturing method provided by the embodiment of the present disclosure, filling the accommodating cavities of each sub-pixel area of a single color with the quantum dot solution of a color corresponding to that of the each sub-pixel area further comprises:

applying a voltage of which polarity is same as that of the quantum dot solution to electrode structures in other sub-pixel areas of different colors.

In a possible implementation mode, in the manufacturing method provided by the embodiment of the present disclosure, the filling the accommodating cavities of each sub-pixel area of a single color with the quantum dot solution of a color corresponding to that of the each sub-pixel area further comprises:

applying a voltage of which polarity is same as that of the quantum dot solution to a second strip electrode.

In a possible implementation mode, the manufacturing method provided by the embodiment of the present disclosure further includes: after filling the accommodating cavities of the sub-pixel areas of each color with the quantum dot solution of the corresponding color, forming an encapsulation layer arranged as a whole layer on a side, away from the base substrate, of the blocking layer, after sequentially filling the accommodating cavities of the sub-pixel areas of different colors with the quantum dot solutions.

In a third aspect, an embodiment of the present disclosure further provides a display panel including the array substrate provided by any embodiment in the first aspect.

DETAILED DESCRIPTION OF THE EMBODIMENTS

Figure 1:
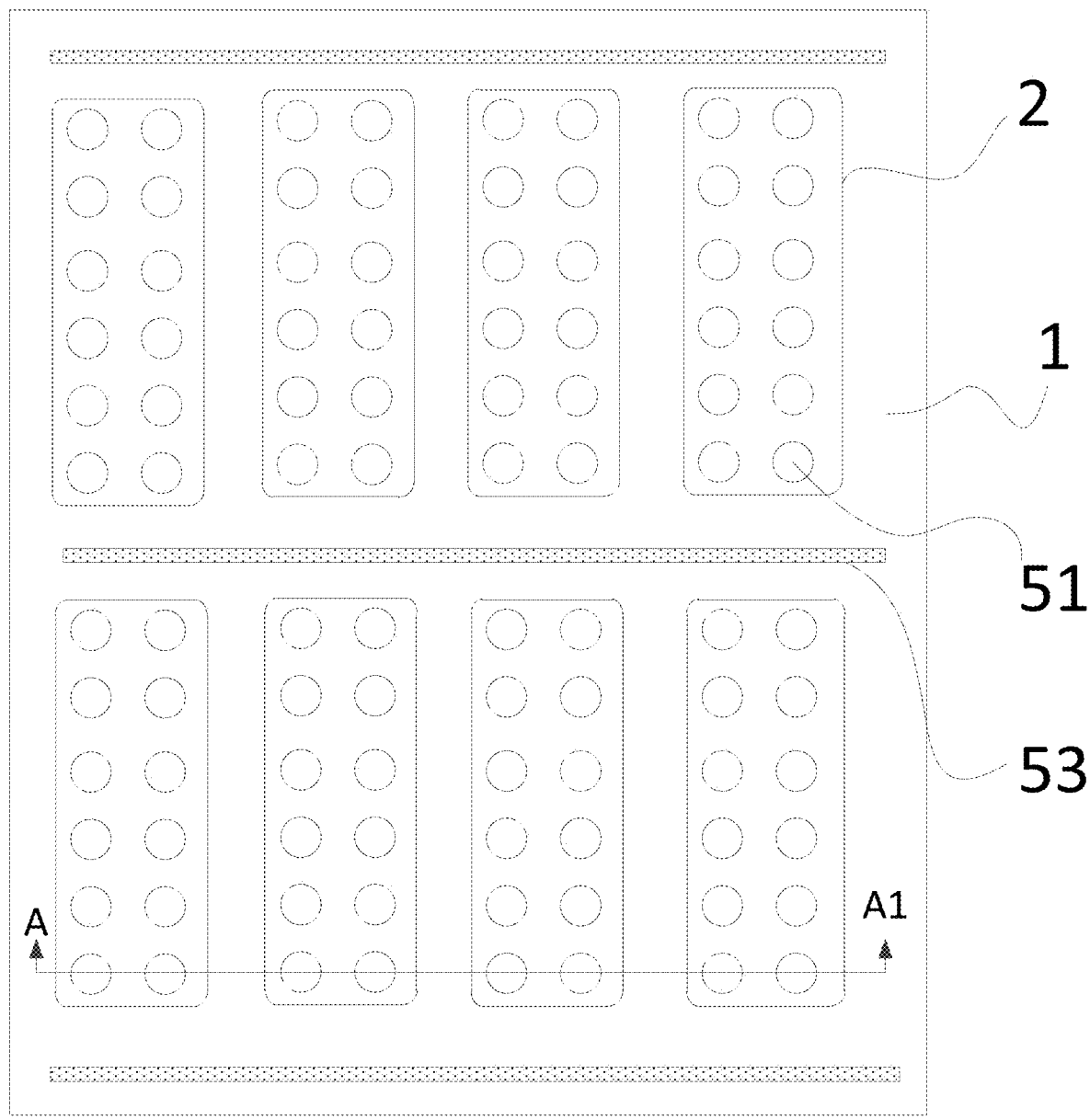
FIG. 1 is a structural schematic diagram of an array substrate provided by an embodiment of the present disclosure.

Aiming at the problem that due to a serious agglomeration phenomenon of scattering particles in a quantum dot solution, quantum dot display panels in related technologies are relatively low in light utilization rate, embodiments of the present disclosure provide an array substrate and a manufacturing method thereof, and a display panel. In order to make objectives, technical solutions, and advantages of the present disclosure clearer, the present disclosure will be further described in detail in combination with accompanying drawings, and obviously, the described embodiments are a part of the embodiments of the present disclosure, but not all the embodiments. Based on the embodiments of the present disclosure, all other embodiments obtained by those skilled in the art without any inventive work should fall within the protection scope of the present disclosure.

The shapes and sizes of components in the accompanying drawings do not reflect true scales, and are only used for illustrating the content of the present disclosure.

An embodiment of the present disclosure provides an array substrate. As shown in FIG. 1-FIG. 3 and FIG. 6, the array substrate includes a base substrate 1, and a plurality of sub-pixel areas 2 positioned on the base substrate 1 and arranged in arrays, wherein each sub-pixel area 2 includes an electrode structure positioned on the base substrate 2, and a function layer 4 and a blocking layer 5 sequentially positioned on the base substrate 1.

The function layer 4 includes a plurality of accommodating cavities 41 arranged at intervals, and the accommodating cavities 41 can be specifically arranged in arrays; the blocking layer 5 is lyophobic and includes through holes 51 in one-to-one corresponding to the accommodating cavities 41.

Diameters of the through holes 51 in the blocking layer 5 satisfy the following conditions: when a voltage is not applied to the electrode structures 3, a charged solution on the blocking layer 5 is prevented from entering the accommodating cavities 41; and when a voltage of which the polarity is opposite to the charged solution on the blocking layer 5 is applied to the electrode structures 3, the charged solution is allowed to enter the accommodating cavities 41.

In some embodiments, in the array substrate provided by the embodiment of the present disclosure, the above array substrate mainly has a structure that surface tension of liquid is used, and when the surface tension of the liquid can resist the gravity, the liquid does not flow in when meeting holes and pores, but is supported outside the holes. By using such a principle, the charged solution is firstly applied to a whole side, and a voltage of which the polarity is the same as the charged solution is then applied to the electrode structures corresponding to the accommodating cavities 41 in which the charged solution does not need to flow, so that the liquid is supported outside the holes under dual effects of the surface tension and electricity. When a voltage of which the polarity is opposite to the charged solution is applied to the electrode structures 3 corresponding to the accommodating cavities 41 in which the charged solution needs to flow, the charged solution may flow to positions on the corresponding accommodating cavities under the effect of an electric field force, and when the electric field force is more than the surface tension, the charged solution may flow into the accommodating cavities.

Figure 6:
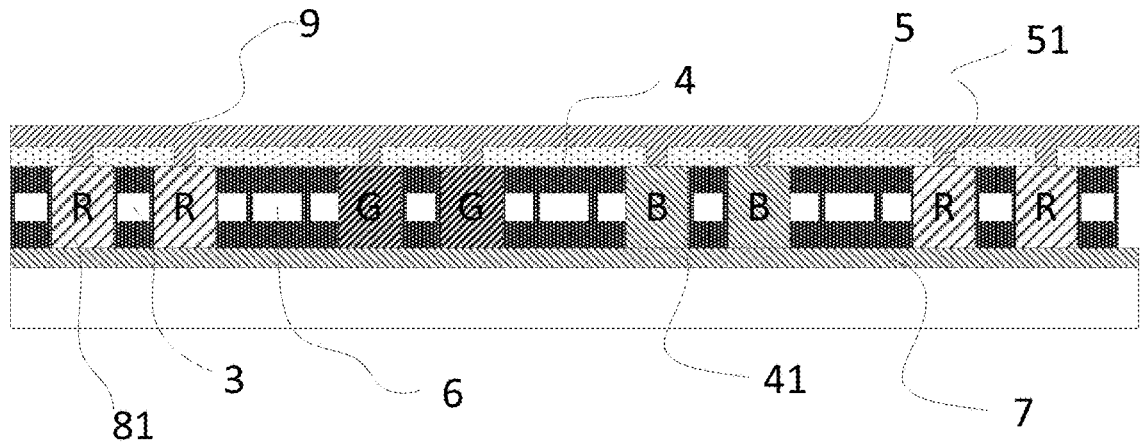
FIG. 6 is a structural schematic diagram of a packaged array substrate provided by an embodiment of the present disclosure.

Optionally, in the array substrate provided by the embodiment of the present disclosure, the charged solution may be a quantum dot solution, and as shown in FIG. 6, the sub-pixel area 2 may also include quantum dot light emitting parts 81 positioned in the accommodating cavities 41, wherein the quantum dot light emitting parts 81 have emitting colors corresponding to colors of the sub-pixel areas 2 and are formed after the quantum dot solution is cured.

The solute material of the quantum dot solution is indium phosphide (InP) with a shell on the outer layer, or a material containing cadmium, and a solvent of the quantum dot solution mainly includes synthetic resin, acrylic, titanium oxide (scattering particles), butyl acetate, a surface tension conditioning agent and the like.

It should be noted that in the array substrate provided by the embodiment of the present disclosure, the diameters of the through holes 51 are designed to conform to the principle that the gravity of the quantum dot solution is borne under small deformation of the quantum dot solution, and the condition that the surface of the substrate is not damaged is ensured. For example, the surface tension of the quantum dot solution is usually $3*10^{-8}$ N/10; the through holes 51 are designed to be able to bear a force of $40*3*10^{-8}$ N/*3 when the diameters of the through holes 51 are 10 μm; each hole corresponds to 5 pl (picolitre) quantum dot solution of which the corresponding gravity is $5*3*10^{-8}$ N/μm and the deformation is 2%-5%, which are balanced after calculation, namely, the diameters of the through holes 51 are set in a way that when no voltage is applied to the electrode structures 3, the quantum dot solution is positioned on a side, far away from the base substrate 1, of the blocking layer 5, without entering the accommodating cavities 41. Optionally, the through holes 51 may have different shapes, for example, when the through holes 51 are round, the diameters of the through holes 51 are generally within the range of 8 μm-15 μm.

In some embodiments, in the array substrate provided by the embodiment of the present disclosure, the accommodating cavities 41 of each sub-pixel area 2 in the structure of the above array substrate are uniformly distributed, so that when the accommodating cavities 41 are filled with the quantum dot solution, the quantum dot solution can be uniformly distributed in the corresponding sub-pixel areas 2, the problem that a light utilization rate is low due to non-uniform distribution of the quantum dot solution is effectively avoided; and according to the structure of the array substrate, filling of the quantum dot solution can be performed in a coating manner, so that the phenomenon that shower nozzles are blocked in related technologies can be avoided.

Optionally, in the array substrate provided by the embodiment of the present disclosure, the electrode structures 3 of the array substrate are used for controlling a moving direction of the quantum dot solution during a coating and filling process of the quantum dot solution, and thus corresponding accommodating cavities 41 are filled with the corresponding quantum dot solution.

Figure 3:
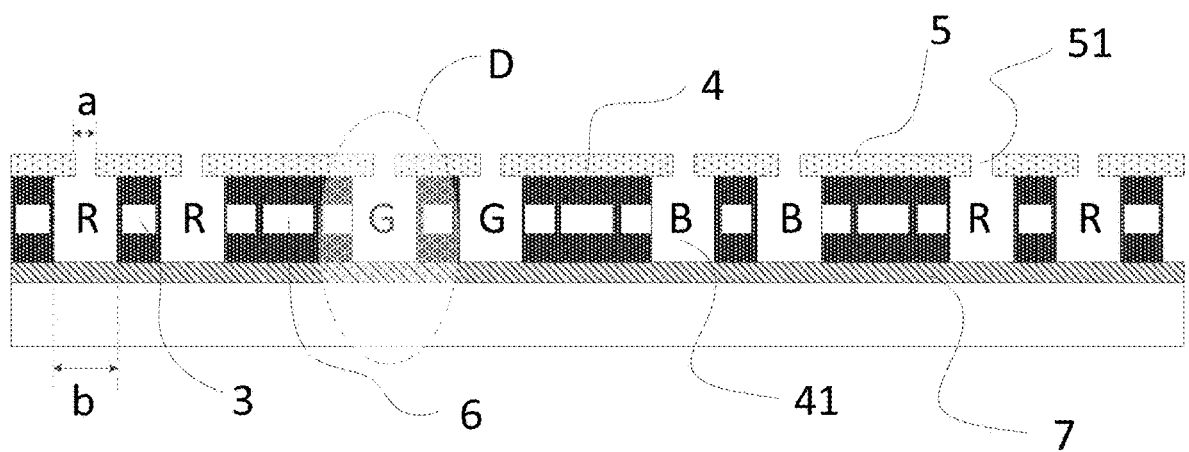
FIG. 3 is a structural schematic diagram of a cross section of an array substrate in a direction A-A1 in FIG. 1.

In some embodiments, FIG. 3 is an example in which each electrode structure 3 includes a plurality of first strip electrodes positioned on two sides of the accommodating cavities 41 in any column. Or the electrode structures 3 may also be positioned between the base substrate 1 and the function layer 4, and the electrode structures positioned in the sub-pixel areas 2 are planar electrodes. The specific structures of the electrode structures 3 may be selected according to actual use conditions and are not limited herein.

It should be noted that, as shown in FIG. 1, the array substrate provided by the embodiment of the present disclosure also includes row blocking structures 53 extending along a row direction on a side, far away from the base substrate, of the blocking layer between the sub-pixel areas in two adjacent lines; the array substrate is divided into uniform areas by the row blocking structures 53, so that dosage of the quantum dot solution in each area is easy to control when the quantum dot solution is coated, and interference of the quantum dot solution in the adjacent areas is avoided. Optionally, the row blocking structures 53 and the blocking layers 5 may be arranged in the same layer; and when the blocking layers are manufactured, the thicknesses of the areas where the row blocking structures 53 are located are greater than those of other areas, and thus a blocking effect is realized.

Optionally, in the array substrate provided by the embodiment of the present disclosure, as shown in FIG. 3, the accommodating cavities 41 of the function layer 4 may have different shapes, for example, when the accommodating cavities 41 are round, the diameters b of the accommodating cavities 41 are generally more than the diameters a of the through holes 51 in the blocking layer 5, so that the amount of the quantum dot solution accommodated by the accommodating cavities 41 can be increased, and thus the luminous efficiency of a display panel is improved and the service life of the display panel can be prolonged. The quantity of the accommodating cavities 41 in each sub-pixel area 2 can be set according to the size of the sub-pixel area 2, and specifically, a distance between each two adjacent accommodating cavities 41 is generally 3 μm-5 μm.

It should be noted that in the array substrate provided by the embodiment of the present disclosure, the through holes 51 in the blocking layer 5 and the accommodating cavities 41 in the function layer 4 can be manufactured via a one-time patterning process; specifically, a larger etching selection ratio is needed between the material of the blocking layer 5 and the material of the function layer 4, namely under a same etching condition, an etching rate of the function layer 4 needs to be more than that of the blocking layer 5, wherein when the etching selection ratio of the material of the blocking layer 5 to the material of the function layer 4 is 1:20, the diameters of the accommodating cavities 41 may be greater than those of the through holes 51. Furthermore, as shown in FIG. 4, by selecting the specific etching condition of the function layer 4, the middle areas of the cross sections of the formed accommodating cavities 41 can be maximal, and areas at two sides of the cross sections close to the blocking layer 5 and the base substrate 1 are smaller, namely the cross sections are distributed from small to large and then to small.

The blocking layer 5 is made from lyophobic materials which may be transparent or may also be non-transparent, optionally may be acrylic system materials containing fluorine, and specifically may be ethyl-(L)-lactic acid, polymerized organosilicon compounds, and 2-hydroxy-2-ethyl-1-phenyl-1-acetone, with thickness about 600-1000 nm; and the main components of the material of the function layer 4 may be polyamide and copper compounds, with thickness about 5-7 μm.

Figure 4:
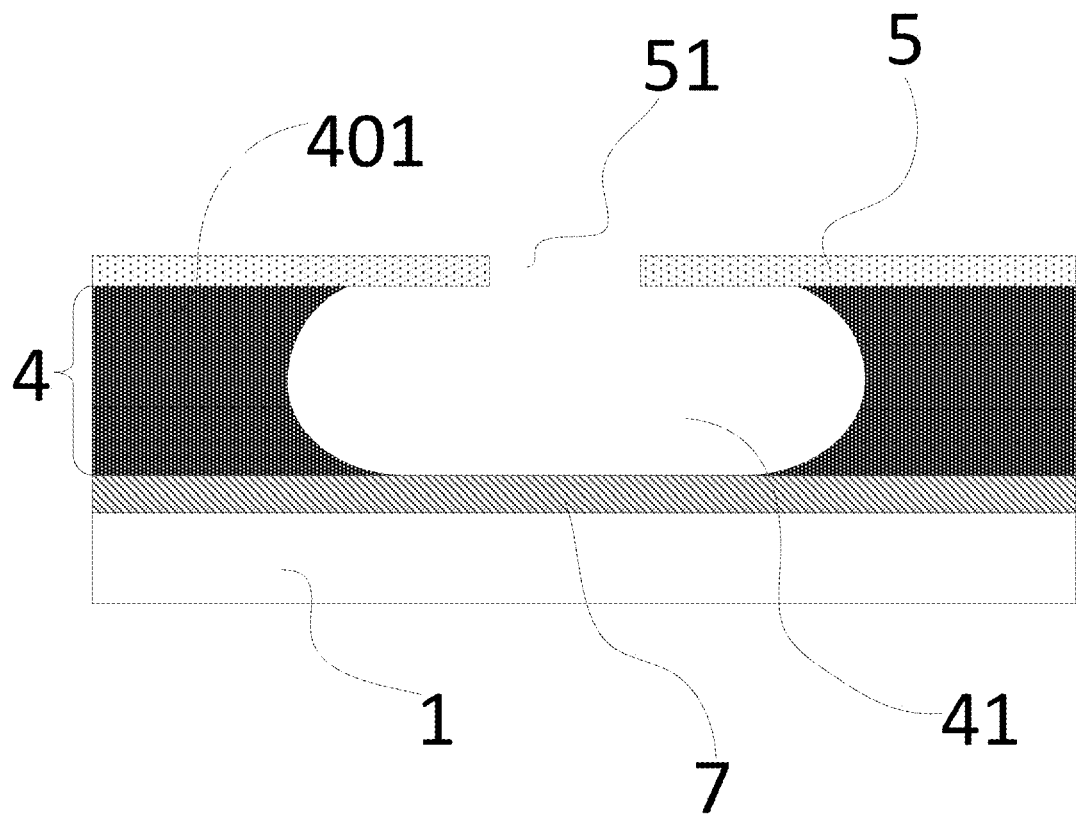
FIG. 4 is a partial enlarged structural schematic diagram of an area D in FIG. 3.

Optionally, in the array substrate provided by the embodiment of the present disclosure, as shown in FIG. 4, the function layer 4 may include a plurality of subfunction layers 401 arranged in a stacking manner, and lyophobicity of each subfunction layer is increased in sequence in a direction that the base substrate 1 points to the blocking layer 5, and the quantum dot solution can be further prevented from entering the accommodating cavities 41 via the through holes 51 in the blocking layer 5.

Figure 2:
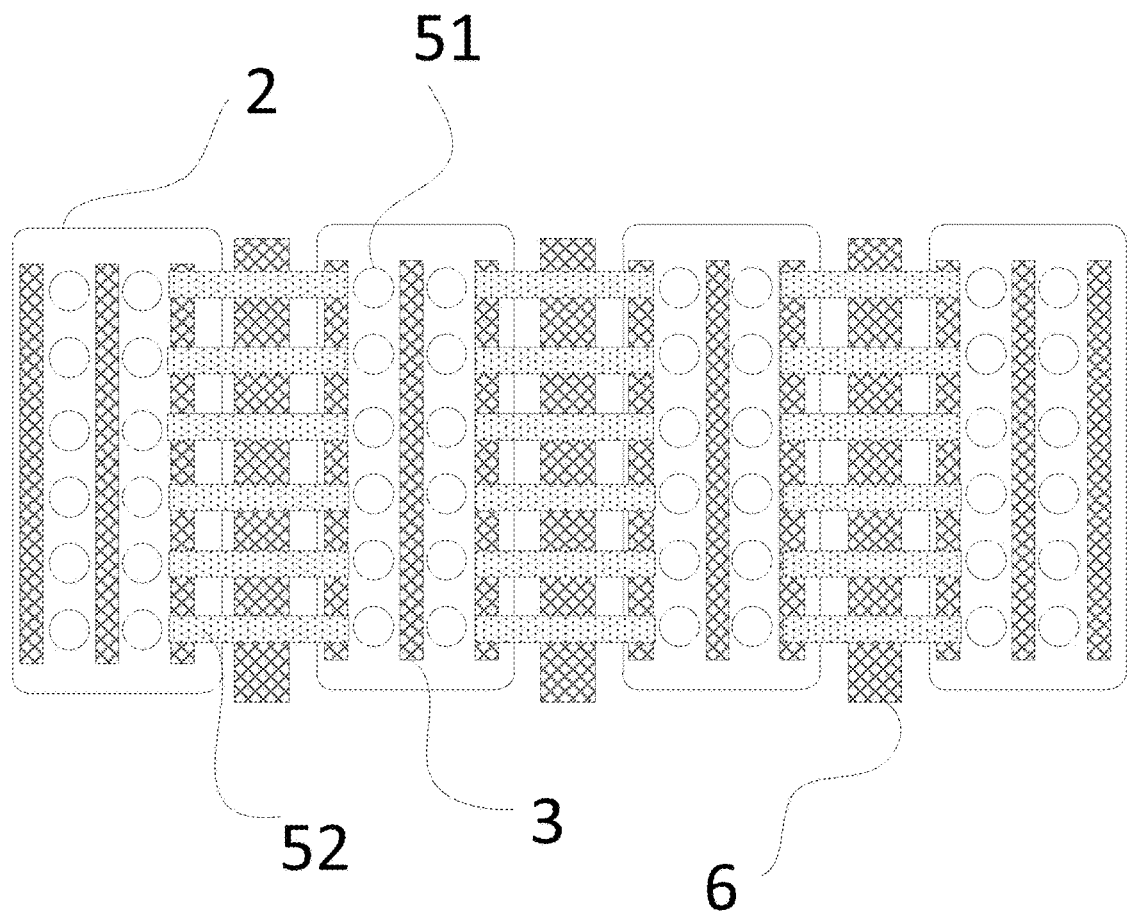
FIG. 2 is a specific structural schematic diagram of an array substrate provided by an embodiment of the present disclosure.

Optionally, in the array substrate provided by the embodiment of the present disclosure, as shown in FIGS. 2 and 3, the electrode structure 3 includes a plurality of first strip electrodes, and the first strip electrodes are positioned on two sides of the accommodating cavities 41 in any column, namely the first strip electrode is arranged on each of two sides of the accommodating cavities 41 in any column.

Optionally, in the array substrate provided by the embodiment of the present disclosure, when the first strip electrodes are positioned on two sides of the accommodating cavities 41 in any column, the electrode structure 3 may be arranged in the same layer with the function layer 4, namely as shown in FIG. 3, the first strip electrodes and the function layer 4 can be regarded to be arranged in a same plane parallel to the base substrate 1; and the electrode structure 3 may also be positioned between the base substrate 1 and the function layer 4, and may also be positioned between the function layer 4 and the blocking layer 5, which is selected according to actual use conditions and is not limited herein.

Optionally, as shown in FIGS. 2 and 3, the array substrate provided by the embodiment of the present disclosure may also include second strip electrodes 6 which are positioned between the adjacent two sub-pixel areas 2 in a row direction and have the same extension direction as the first strip electrodes. The first strip electrodes and the second strip electrodes 6 can extend along the column direction of the sub-pixel areas 2 and can be arranged along the row direction. Furthermore, the widths of the two electrodes may be the same, or may be different, which is not limited herein.

Optionally, in the array substrate provided by the embodiment of the present disclosure, during a process of filling the accommodating cavities 41 with the quantum dot solution, a voltage of which the electrical property is the same as the quantum dot solution is applied to the second strip electrodes 6, so as to drive the quantum dot solution to the corresponding sub-pixel areas 2.

Optionally, in the array substrate provided by the embodiment of the present disclosure, as shown in FIGS. 2 and 3, the first strip electrodes can be arranged in the same layer with the second strip electrodes 6, so that the electrode structure 3 and the second strip electrodes are manufactured via a one-time patterning process, and thus the manufacturing process is reduced, and the product cost is saved.

Optionally, in the array substrate provided by the embodiment of the present disclosure, as shown in FIG. 2, between the adjacent two sub-pixel areas 2 in the row direction, each blocking layer 5 may be provided with a plurality of diversion grooves 52 extending along the row direction. Specifically, the diversion grooves 52 may be slots formed in the surface of the side, far away from the function layer 4, of the blocking layer 5.

Optionally, in the array substrate provided by the embodiment of the present disclosure, when the quantum dot solution is driven to the corresponding sub-pixel areas 2 by each electrode, the arrangement of the diversion grooves 52 may promote flowing of the quantum dot solution.

It should be noted that the row direction mentioned in the present disclosure is generally a horizontal direction, and the column direction is generally a vertical direction, and in other embodiments, the positions of the row direction and the column direction may be exchanged.

Optionally, as shown in FIG. 3, the array substrate provided by the embodiment of the present disclosure may also include a buffer layer 7 arranged as a whole layer between the function layer 4 and the base substrate 1, wherein the buffer layer is lyophilic. Optionally, the buffer layer may be made from silicon nitride, silicon oxide or organic resin materials, and lyophilic performance is adjusted by adjusting fluorine content of the materials; if the overall fluorine content is small, a film layer is lyophilic; and if the overall fluorine content is large, the film layer is lyophobic.

Optionally, in the array substrate provided by the embodiment of the present disclosure, through the arrangement of the lyophilic buffer layer 7, the quantum dot solution may be limited in the accommodating cavities 41, wherein the thickness of the buffer layer 7 is approximately 200 nm.

Figure 5:
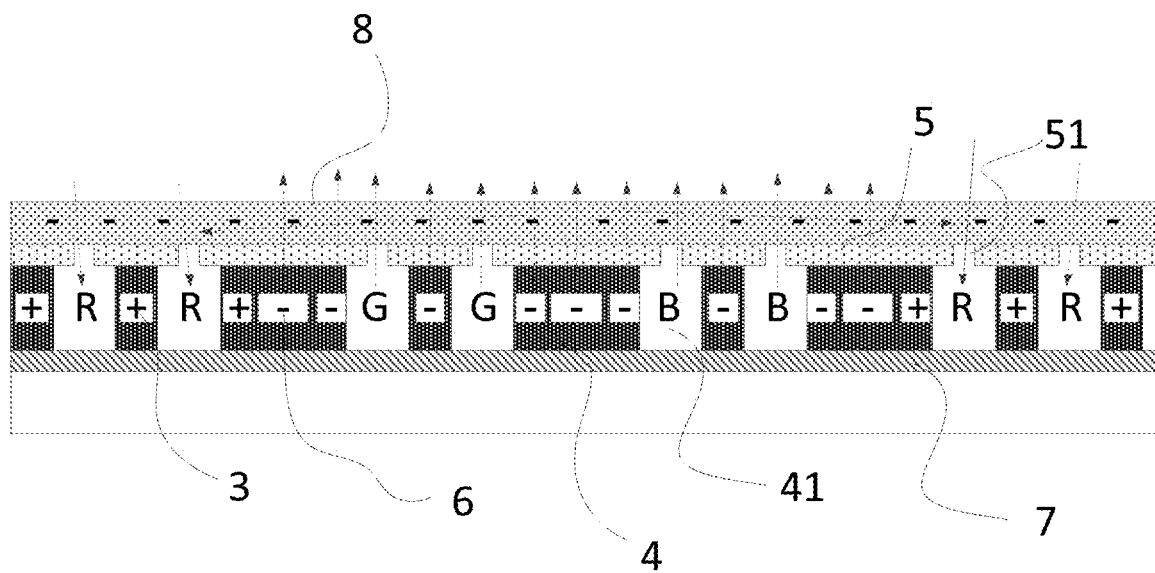
FIG. 5 is a schematic diagram of a quantum dot solution filling process provided by an embodiment of the present disclosure.

Optionally, in the array substrate provided by the embodiment of the present disclosure, the principle of filling the corresponding accommodating cavities with the quantum dot solution is as follows: as shown in FIG. 5, firstly, the side, far away from the base substrate 1, of the blocking layer 5 is coated with the quantum dot solution 8; due to the diameters of the through holes 51, the quantum dot solution 8 can be prevented from entering the accommodating cavities 41 via the through holes 51 in the blocking layer 5; if the quantum dot solution 8 is the quantum dot solution (for example being negatively charged) corresponding to red sub-pixel areas R, a positive voltage is applied to the electrode structures 3 in the red sub-pixel areas R, and a negative voltage is applied to the other sub-pixel areas; since the quantum pot solution 8 is negatively charged, under the effect of the negative voltage of the electrode structures 3 in blue sub-pixel areas B and green sub-pixel areas the quantum dot solution 8 in the blue sub-pixel areas B and the green sub-pixel areas G suffers from a repulsing force, so that the quantum dot solution 8 in the areas is driven to move towards the red sub-pixel areas R; the positive voltage is applied to the electrode structures 3 in the red sub-pixel areas R, so that the quantum dot solution 8 in red sub-pixel areas R is attracted; along with increase of the positive voltage applied to the electrode structures 3 in the red sub-pixel areas R, a joint effect of the gravity of the quantum dot solution 8 in the areas and electricity is more than the effect of surface tension of the quantum dot solution 8, so that the quantum dot solution 8 enters the accommodating cavities in the red sub-pixel areas R, and thus filling of the quantum dot solution into the red sub-pixel areas R is completed. Filling processes of the quantum dot solution into the sub-pixel areas of other colors is the same as the principle mentioned above, and will not be repeated herein.

The structure of the filled array substrate is as shown in FIG. 6, after being filled, the quantum dot solution is cured to form quantum dot light emitting parts 81. Optionally, curing treatment may be determined according to a solvent of the quantum dot solution 8, for example, the solvent is a resinous material, and thus photocuring can be used.

Optionally, as shown in FIG. 6, the array substrate provided by the embodiment of the present disclosure may also include an encapsulation layer 9 arranged as a whole layer on the side, far away from the base substrate 1, of the blocking layer 5.

Figure 7:
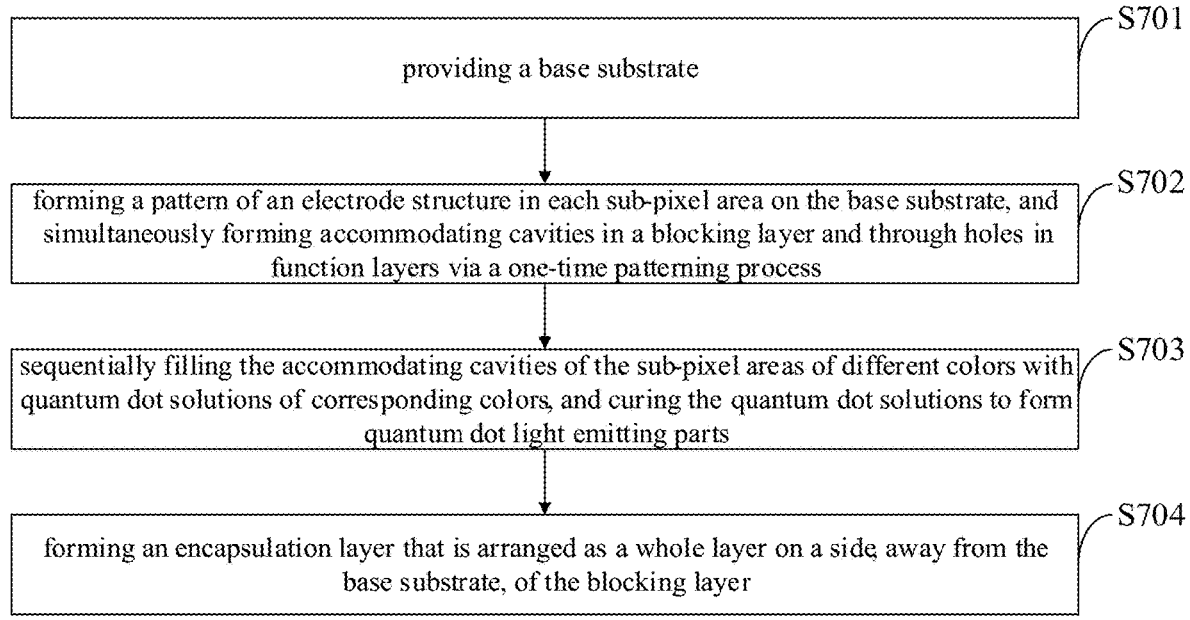
FIG. 7 is a flow chart of a manufacturing method of the array substrate provided by an embodiment of the present disclosure.

Based on a same inventive concept, as shown in FIG. 7, an embodiment of the present disclosure also provides a manufacturing method of the array substrate, including following steps:

S701, providing a base substrate; and

S702, forming a pattern of an electrode structure in each sub-pixel area on the base substrate, and simultaneously forming accommodating cavities in blocking layers and through holes in function layers via a one-time patterning process, wherein optionally, the through holes and the accommodating cavities may be formed by a one-time photoetching process, and the photoetching process is the process of forming patterns by using photoresist, mask plates and exposure machines during technological processes such as film building, exposing and developing.

Optionally, as shown in FIG. 7, the above manufacturing method provided by the embodiment of the present disclosure may also include a following step:

S703, sequentially filling the accommodating cavities of the sub-pixel areas of different colors with quantum dot solutions of corresponding colors, and carrying out curing to form quantum dot light emitting parts.

Figure 8:
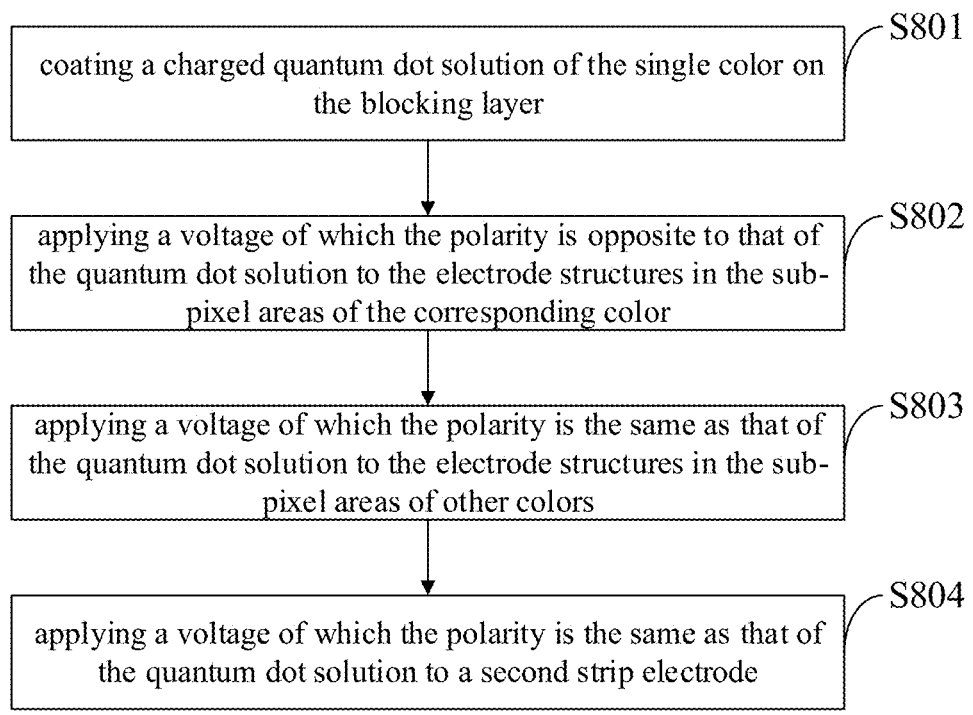
FIG. 8 is a specific flow chart of a manufacturing method of the array substrate provided by an embodiment of the present disclosure.

As shown in FIG. 8, the step of filling the accommodating cavities of the sub-pixel areas of the single color with the quantum dot solution of the corresponding color includes a following steps:

S801, coating a charged quantum dot solution of the single color on each blocking layer, wherein the dosage of the coated quantum dot solution needs to be determined according to the specific volumes of the accommodating cavities; and S802, applying a voltage of which the polarity is opposite to the quantum dot solution to the electrode structures in the sub-pixel areas corresponding to the quantum dot solution in color, and thus enabling the quantum dot solution to enter the accommodating cavities in the sub-pixel areas of the corresponding color.

Optionally, as shown in FIG. 8, in the manufacturing method, the step of filling the accommodating cavities of the sub-pixel areas of the single color with the quantum dot solution of the corresponding color may also include a following step:

S803, applying a voltage of which the polarity is the same as the quantum dot solution to the electrode structures in the sub-pixel areas of other colors.

Optionally, as shown in FIG. 8, in the manufacturing method, the step of filling the accommodating cavities of the sub-pixel areas of the single color with the quantum dot solution of the corresponding color may also include a following step:

S804, applying a voltage of which the polarity is the same as the quantum dot solution to second strip electrodes.

It should be noted that the steps S802-S804 may be executed at the same time.

Optionally, after the step of filling the accommodating cavities of the sub-pixel areas of each color with the quantum dot solution of the corresponding color, as shown in FIG. 7, the manufacturing method may also include a following step:

S704, forming an encapsulation layer that is arranged as a whole layer on the side, away from the base substrate, of the blocking layer.

Optionally, the step of curing the quantum dot solution filled into the accommodating cavities to form the quantum dot light emitting parts may be immediately executed after the accommodating cavities in each sub-pixel area are filled with the quantum dot solution of the corresponding color, and may also be executed after the encapsulation layer is formed. Or, a curing treatment may be executed once after the quantum dot solution of each color is filled into the corresponding sub-pixel areas. The specific curing treatment is determined according to the solvent of the quantum dot solution, for example, photocuring treatment can be used when a resin solvent is used.

The manufacturing method of the above array substrate is described in detail in the embodiments of the array substrate, and the formed structures and beneficial effects that can be achieved are the same as those of the above array substrate, and will not be repeated herein.

Based on a same invention concept, an embodiment of the present disclosure also provides a display panel including the array substrate provided by above embodiments. The principle of the display panel for solving problems is similar to that of the above array substrate, so that the implementation of the display panel can refer to that of the above array substrate, and repetitive points will not be repeated herein.

The embodiments of the present disclosure provides an array substrate and a manufacturing method thereof, and a display panel. The array substrate includes a base substrate, and a plurality of sub-pixel areas positioned on the base substrate and arranged in arrays, wherein the sub-pixel areas include electrode structures, and function layers and blocking layers sequentially positioned on the base substrate; the function layers respectively includes a plurality of accommodating cavities arranged at intervals; the blocking layers are lyophobic and respectively includes through holes in one-to-one corresponding to the accommodating cavities; and diameters of the through holes meet the following conditions: when a voltage is not applied to the electrode structures, a charged solution on each blocking layer is prevented from entering the accommodating cavities; and when a voltage of which the polarity is opposite to the charged solution on each blocking layer is applied to the electrode structures, the charged solution is allowed to enter the accommodating cavities.

Each sub-pixel area in the structure of the above array substrate includes a plurality of uniformly distributed accommodating cavities which are filled with the accommodating cavities, so that the charged solution can be uniformly distributed in the corresponding sub-pixel areas, the problem that a light utilization rate is low due to non-uniform distribution of the charged solution is effectively avoided; and according to the structure of the above array substrate, filling of the charged solution can be performed in a coating manner, so that the phenomenon that shower nozzles are blocked in related technologies can be avoided.

Obviously, those skilled in the art can make various modifications and variations to the present disclosure without departing from the spirit and scope of the present disclosure. Therefore, if these modifications and variations of the present disclosure fall within the scope of the claims of the present disclosure and equivalent technologies thereof, the present disclosure is also intended to include these modifications and variations.

The invention claimed is:

1. An array substrate, comprising a plurality of sub-pixel areas, wherein the sub-pixel areas comprise:
    an electrode structure arranged on a base substrate;
    a function layer arranged on the base substrate, and comprising a plurality of accommodating cavities arranged spaced with each other; and
    a blocking layer arranged on a side, away from the base substrate, of the function layer, and being lyophobic, wherein the blocking layer comprises through holes in one-to-one corresponding to the accommodating cavities, and hole diameters of the through holes are set to satisfy following conditions: in response to that a voltage is not applied to the electrode structure, a charged solution on the blocking layer is prevented from entering the accommodating cavities; and in response to that a voltage of which polarity is opposite to charged solution on the blocking layer is applied to the electrode structure, the charged solution is allowed to enter the accommodating cavities;
    wherein the charged solution is a quantum dot solution; and the array substrate further comprises quantum dot light emitting parts arranged in the accommodating cavities, the quantum dot light emitting parts have emitting colors corresponding to the sub-pixel areas and are formed through cured quantum dot solution.

2. The array substrate according to claim 1, wherein diameters of the accommodating cavities are greater than those of the through holes.

3. The array substrate according to claim 2, wherein the diameters of the through holes are within the range of 8 μm-15 μm.

4. The array substrate according to claim 1, wherein the function layer comprises a plurality of subfunction layers arranged in a stacking manner, and a lyophobicity of the subfunction layers is sequentially increased in a direction that the base substrate points to the blocking layer.

5. The array substrate according to claim 1, wherein the accommodating cavities are arranged in arrays, the electrode structure comprises a plurality of first strip electrodes, and the first strip electrodes are distributed on two sides of the accommodating cavities in any column.

6. The array substrate according to claim 5, further comprising a second strip electrode arranged between any two adjacent sub-pixel areas, and the second strip electrode extends in an extension direction same as that of the first strip electrodes.

7. The array substrate according to claim 6, wherein the first strip electrodes and the second strip electrode are arranged in a same layer.

8. The array substrate according to claim 5, wherein the blocking layer comprises a plurality of grooves arranged between any two adjacent sub-pixel areas in a row direction, the grooves extend along the row direction; the row direction is vertical to an extending direction of the column.

9. The array substrate according to claim 5, wherein the blocking layer comprises a row blocking structure arranged between any two adjacent sub-pixel areas in a row direction, the row blocking structure extends along the row direction; the row direction is vertical to an extending direction of the column.

10. The array substrate according to claim 1, further comprising a buffer layer arranged between the function layer and the base substrate, wherein the buffer layer is lyophilic.

11. The array substrate according to claim 1, further comprising an encapsulation layer arranged as a whole layer on a side, away from the base substrate, of the blocking layer.

12. A manufacturing method of the array substrate according to claim 1, comprising:
providing a base substrate; and
forming a pattern of an electrode structure in the sub-pixel areas on the base substrate, and simultaneously forming accommodating cavities in the blocking layer and through holes in function layers via a one-time patterning process.

13. The manufacturing method according to claim 12, further comprising:
sequentially filling the accommodating cavities of the sub-pixel areas of different colors with quantum dot solutions of colors corresponding to that of the sub-pixel areas, and curing the quantum dot solutions to form quantum dot emitting parts,
wherein filling the accommodating cavities of each sub-pixel area of a single color with the quantum dot solution of a color corresponding to that of the each sub-pixel area comprises:
coating the blocking layer with the charged quantum dot solution of the single color, applying a voltage of which polarity is opposite to the quantum dot solution to the electrode structure in the each sub-pixel area corresponding to the single color of the quantum dot solution, so as to enable the quantum dot solution to enter the accommodating cavities in the each sub-pixel areas.

14. The manufacturing method according to claim 13, wherein the filling the accommodating cavities of each sub-pixel area of a single color with the quantum dot solution of a color corresponding to that of the each sub-pixel area further comprises:
applying a voltage of which polarity is same as that of the quantum dot solution to electrode structures in other sub-pixel areas of different colors.

15. The manufacturing method according to claim 13, wherein the array substrate further comprising a second strip electrode arranged between any two adjacent sub-pixel areas, and the second strip electrode extends in an extension direction same as that of the first strip electrodes; wherein the filling the accommodating cavities of each sub-pixel area of a single color with the quantum dot solution of a color corresponding to that of the each sub-pixel area further comprises:
applying a voltage of which polarity is same as that of the quantum dot solution to the second strip electrode.

16. The manufacturing method according to claim 13, further comprising: after filling the accommodating cavities of the sub-pixel areas of each color with the quantum dot solution of the corresponding color, forming an encapsulation layer arranged as a whole layer on a side, away from the base substrate, of the blocking layer, after sequentially filling the accommodating cavities of the sub-pixel areas of different colors with the quantum dot solutions.

17. A display panel, comprising the array substrate according to claim 1.

* * * * *